United States Patent [19]

Karasawa

[11] Patent Number: 4,812,901

[45] Date of Patent: Mar. 14, 1989

[54] PROBE APPARATUS

[75] Inventor: Wataru Karasawa, Yokohama, Japan

[73] Assignee: Tokyo Electron Limited, Tokyo, Japan

[21] Appl. No.: 100,199

[22] Filed: Sep. 23, 1987

[30] Foreign Application Priority Data

Sep. 30, 1986 [JP] Japan .................................. 61-233480

[51] Int. Cl.⁴ .................................................. H04N 7/00
[52] U.S. Cl. ...................................... 358/101; 358/107
[58] Field of Search ................. 73/865.8; 358/107, 96, 358/108, 101; 324/158 F, 158 P, 158 R, 73 PC

[56] References Cited

U.S. PATENT DOCUMENTS

| | | | |
|---|---|---|---|
| 3,810,017 | 5/1974 | Wiesler et al. | 324/158 P |
| 3,899,634 | 8/1975 | Montone et al. | 358/101 |
| 4,104,589 | 8/1978 | Baker et al. | 324/158 P |
| 4,301,470 | 11/1981 | Pagany | 358/101 |
| 4,538,177 | 8/1985 | Morison | 358/101 |
| 4,607,220 | 8/1986 | Hollman | 324/158 F |
| 4,651,203 | 3/1987 | Peterson | 358/107 |
| 4,677,474 | 6/1987 | Sato et al. | 324/158 P |

FOREIGN PATENT DOCUMENTS 0064181 4/1982 Japan .................................. 324/158 P

OTHER PUBLICATIONS

Beldring et al., "Fiber Optic Sensor for Testing and Sorting Semiconductor Devices", Western Electric, Dig. No. 33, Jan. 1974, pp. 11–12.

Primary Examiner—Stewart J. Levy
Assistant Examiner—Robert R. Raevis
Attorney, Agent, or Firm—Oblon, Fisher, Spivak, McClelland & Maier

[57] ABSTRACT

A probe apparatus is disclosed, in which, when performing a predetermined processing on an object having a pattern recurring at a predetermined pitch by moving the object at a pitch equal to the predetermined pitch, the difference between the pitch of actual movement of the object and the pitch of the recurrence of pattern is detected by pattern recognition, and the pitch of movement of the object is corrected according to the detected difference.

5 Claims, 4 Drawing Sheets

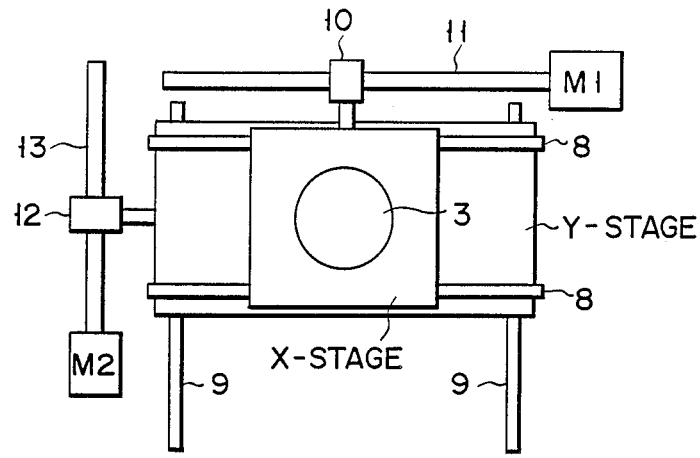
F I G. 3
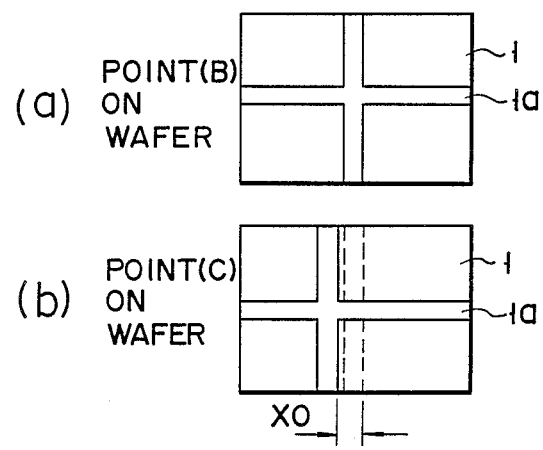
F I G. 6

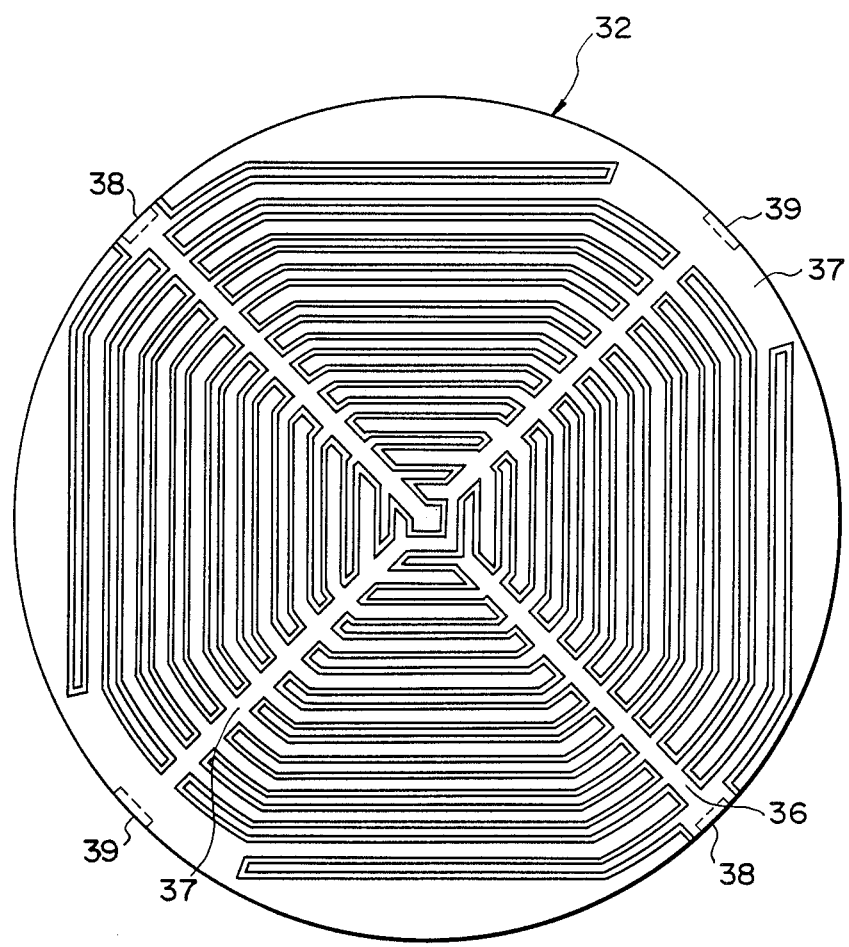
F I G. 5

PROBE APPARATUS

BACKGROUND OF THE INVENTION

The measurement of characteristics of each chip of a semiconductor wafer, on which a plurality of chips having a fixed pattern are formed at a predetermined pitch a (hereinafter referred to as wafer), is usually performed using a wafer prober. In this case, the wafer with the chips to be measured is placed on an X-Y stage, and the characteristics of each chip are measured with the wafer prober by moving the wafer along the X-Y stage in an X-direction (transversal direction) or Y-direction (longitudinal direction) at the pitch a noted above. In this case, if the pitch a, at which the individual chips are arranged, is exactly the same as the pitch a', at which the wafer is moved along the X-Y stage, the wafer prober is set to a position corresponding to a given chip on the wafer when the wafer is moved a predetermined distance in the X-direction. Thus, there occurs no positional deviation between the wafer prober and the chip to be measured. Actually, however, mechanical errors occur in driving the X-Y stage and other parts as well as errors caused in the X-Y stage and other parts due to temperature variations at the time of the measurement. Therefore, there arises an error $\Delta a$ between the actual pitch a' of the movement of the wafer and the arrangement pitch of the chips. Therefore, when the wafer is moved N times in a predetermined direction, an accumulation error of $\Delta a \times N$ is produced. Further, the wafer sometimes has a fixing distortion produced in a photolithographic step, and in this case it is possible that the individual chips fail to be arranged correctly on the wafer. In such a case, when the wafer is moved along the X-Y stage, the wafer prober is liable to be set at a position deviated from the chip to be measured.

Heretofore, as a method of correcting such errors, there is one, in which the accumulation error produced in correspondence to the movement of the wafer is measured using a microscope, and then either (1) a screw of a drive motor of the X-Y stage for determining the extent of movement of the wafer is caused to be moved a predetermined distance in a predetermined direction or (2) the revolving rate of the drive motor is controlled.

In method (1), the drive motor is used to determine the distance which the wafer is moved in the X-direction, in accordance with the movement of a screw nut used for connecting the screw and the X-rails together. If the screw and the X-rails are set in parallel to each other, the screw nut is allowed to move to the maximum degree. If the screw and the X-rails are set within a certain angle therebetween, the degree of movement of the screw nut is limited, in comparison with the case where the screw nut and the X-rays are set parallel. In this way, the drive motor is used to determine the moving distance of the wafer by merely changing the setting direction of the screw nut, i.e., without the need to change the revolving rate of the motor.

In method (2), for every movement of the wafer the revolving rate of drive motor M is controlled to vary the extent of movement of the wafer in the X-direction.

Method (1), however, involves a very large number of steps. Further, in both methods (1) and (2), the error is measured with a microscope, and the operator corrects the extent of movement of the wafer according to the measured value of error. Therefore, the measurement of error requires great time and labor. Further, it is impossible to correct errors due to the measured temperature or material of the wafer. Furthermore, since the error accumulation corresponding to the measured errors is corrected, errors in the arrangement of chips, which are produced in the photolithographic step and are not related to the movement of the wafer, can not be corrected.

SUMMARY OF THE INVENTION

According to the invention, there is provided a probe apparatus comprising:

means for moving an object having identical patterns arranged at a predetermined pitch, at a pitch equal to said predetermined pitch;

processing means for processing the object as the object is moved;

photographing means for photographing the pattern at at least two points while the object is being moved;

detecting means for detecting a difference between the movement of the object and the pitch of arrangement pitch of said patterns, from the photographs of the patterns provided by said photographing means; and means for correcting the pitch of movement in accordance with the difference detected by said correcting means.

In the probe apparatus, when performing a predetermined processing on a measurement object, various errors such as those due to measurement temperature of the measurement object and those present in the measurement object itself as well as mechanical errors accompanying the movement of the measurement object can be readily and accurately corrected in a short period of time by making use of pattern recognition techniques.

BRIEF DESCRIPTION OF THE DRAWINGS

FIG. 3 is a schematic plan view showing the construction of an X-Y stage;

FIG. 5 is a plan view showing an electrode structure of a chuck top; and

FIG. 6(a) shows a pattern image formed at predetermined location B on the wafer, and FIG. 6(b) shows a pattern image which is formed at final point C on the wafer when the wafer shown in FIG. 1 has been moved a predetermined distance by driving the X-Y stage.

DETAILED DESCRIPTION OF TH PREFERRED EMBODIMENTS

Figure 1:
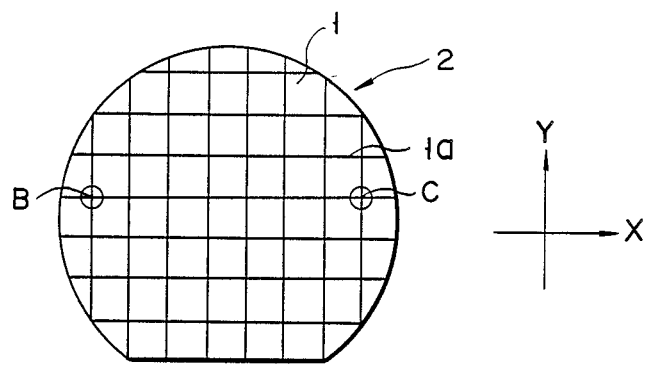
FIG. 1 is a plan view showing a wafer.
Figure 2:
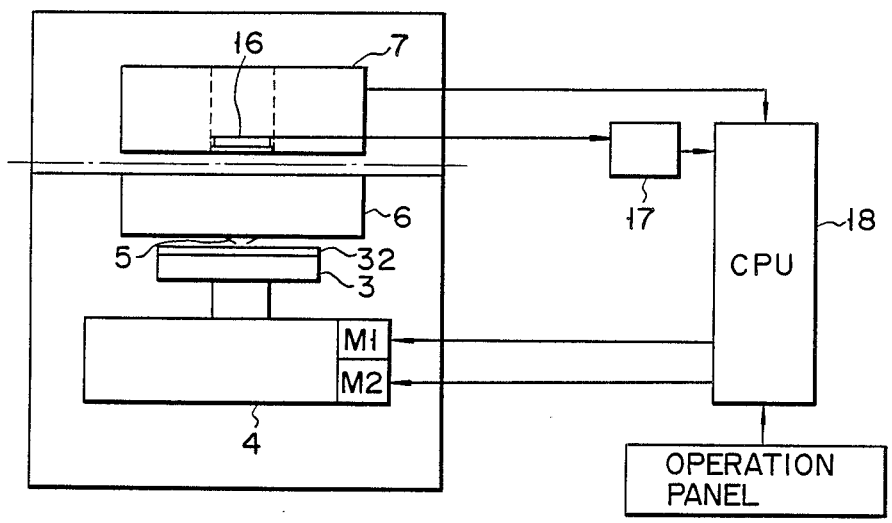
FIG. 2 is a schematic front view showing the construction of a prober.

Now, the probe apparatus according to the invention will be described in conjunction with an embodiment thereof applied to a wafer prober with reference to the accompanying drawings. FIG. 1 shows wafer 2 having a plurality of chips 1 to be measured. Chips 1 all have the same shape and are arranged on wafer 2 at a predetermined pitch in an X-direction (transversal direction) and Y-direction (longitudinal direction). FIG. 2 shows X-Y stage 4 having chuck 3, on which such wafer 2 is supported. Above chuck 3, a prober having prober needles for measuring the characteristics of each chip 1 is provided. Wafer 2 is supported on chuck 3 such that X- and Y-directions of X-Y stage 4 and X- and Y-directions of the chip arrangement coincide with one another. Further, wafer 2 is positioned so that its streets 1a defining individual chips 1 are aligned to the X- and Y-axes of Y-Y stage 4. After wafer 1 has been correctly positioned on chuck 3, X-Y stage 4 is driven, while prober needles 5 are synchronously brought into contact with pads or electrodes (not shown) of chips 1, whereby electric characteristics of each chip 1 are measured with test head 7 which is electrically connected to the prober.

Now, X-Y stage 4 will be described with reference to FIG. 3. X-Y stage 4 consists of X-rails 8, along which chuck 3 can be moved in X-directions, Y-rails 9, along which chuck 3 can be moved in Y-directions, X-axis drive motor M1 for driving screw 11 engaging with screw nut 10 coupled to the X stage and Y-axis drive motor M2 for driving screw 13 engaging with screw nut 12 coupled to the Y stage. Thus, by driving X-axis drive motor M1, screw 11 is turned to move chuck 3 coupled to screw nut 10 along X-rails 8, while, by driving Y-axis drive motor M2, screw 13 is turned to move chuck 3 coupled to screw nut 12 along Y-rails 9. Between insert ring 6, on which prober needles 5 are mounted, and test head 7, there is provided television camera 16 (FIG. 2) which effects pattern recognition of chips 3. Television camera 16 may be disposed on an alignment stage (not shown) for positioning wafer 2. There has already been developed a prober, in which television camera 16 is disposed on insert ring 6 for the positioning of a pad on chip 1 and prober needles 5. Television camera 16 can be utilized in such a manner. The output of television camera 16 is supplied to pattern recognition unit 17, and the outputs of pattern recognition unit 17 and test head 7 are provided to CPU 18.

Figure 4:
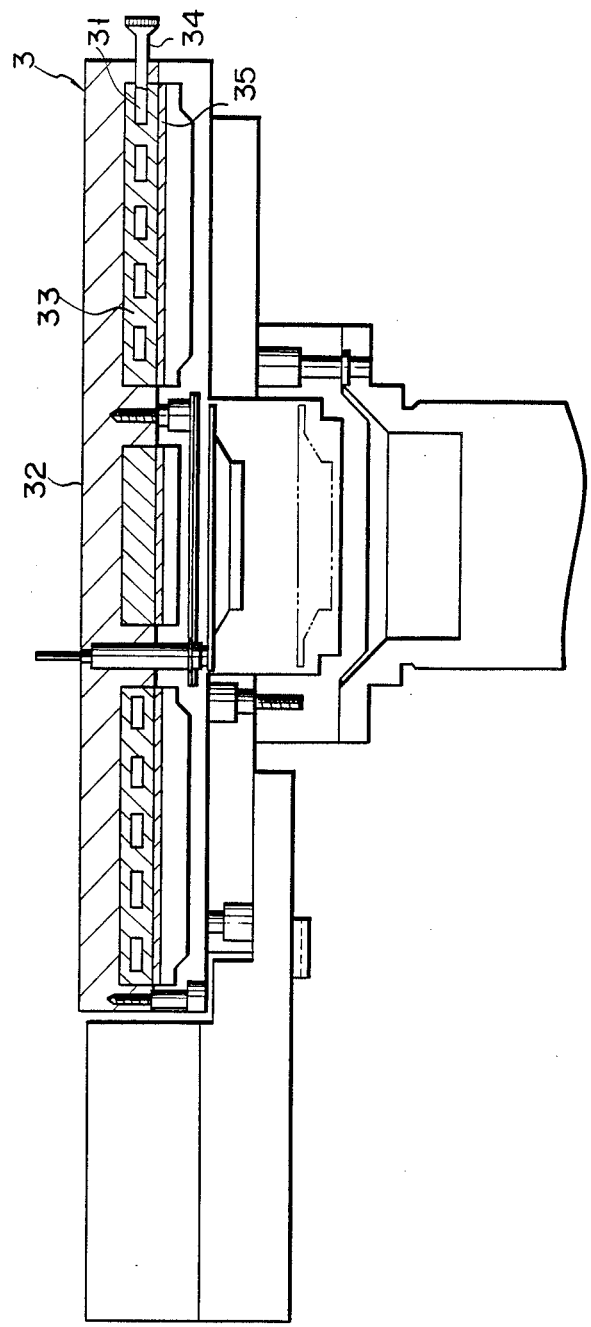
FIG. 4 is a sectional view, partly broken away, showing the construction of a chunk.

Now, chuck 3 will be described with reference to FIG. 4. Chuck 3 contains inner cooling jacket 31. Cooling jacket 31 is laid such that it is in contact with substantially the entirety of the back surface of chuck top 32. Cooling jacket 31 constitutes coolant flow path having a uniform thickness. More particularly, cooling jacket 31 consists of ribs 33 made of a metal having a high heat conductivity, e.g., aluminum, which have a uniform width in the thickness direction and define a meandering or lattice-like coolant path. These ribs 33 serve to prevent vortex flow in the coolant path and reduce loss of the coolant, thus permitting ready passage of a large quantity of the coolant to improve the heat exchange efficiency of coolant jacket 31. The coolant is desirably nonfreezing liquid, e.g., an aqueous solution of ethylene glycol. Also, it is possible to use liquified nitrogen, fluorocarbon and mixture of fluorocarbon and non-freezing liquid as the coolant. The material of cooling jacket 31 should be copper or other material having high heat conductivity. The side surface of ribs 33 is provided with port 34, which serves as a supply port for supplying the coolant into cooling jacket 31 or as a discharge port for discharging the coolant. The cooling liquid is circulated from port 34 through cooling jacket 31 and returned to a cooling unit.

On the lower surface of cooling jacket 31 is arranged heater 35, which is as broad as and substantially corresponds to the entire surface of chuck 3 and consists of planar heat radiators or the like. Heater 35 is provided on the lower surface of cooling jacket 31 in this way, because otherwise, i.e., if it is provided on the upper surface, it provides an action of heat insulator to prevent the cooling action of cooling jacket 31. Further, even with the provision of heater 35 at the position noted above, the heat of heater 35 can be smoothly transferred to chuck top 32. It is thus possible to obtain fine adjustment of the cooling temperature of cooling jacket 31 with the heating action of heater 35. Further, it is possible to make the temperature of chuck top 32 uniform by making use of the heating action of heater 35. It has been experimentarily proved that the temperature of chuck top 32 can be set to a desired value in a range of $-10°$ to $+150°$ C.

Chuck 3 as described above is operated as follows. Cooling liquid at a temperature slightly lower than the preset temperature of chuck top 32 is caused to pass through cooling jacket 31. Then, heater 35 is energized for fine adjustment of the temperature of the coolant to a predetermined temperature. The temperature of wafer 2 on chuck top 32 is detected by a plurality of temperature sensors such as thermistors (not shown). The temperature thus detected is compared with a preset temperature. Then, the current flowing through heater 35 is controlled to make the temperature of the wafer 2 equal to the preset temperature. In this fashion, the temperature of the coolant is automatically controlled.

The temperature of the non-freezing liquid can be set to a desired value through on-off control of a freezer. Further, it has been experimentarily confirmed that the surface temperature distribution of chuck top 32 can be set within $2C°$ by arranging temperature sensors in a dispersed fashion in the radial direction of chuck top 32.

A drive unit is usually provided below chuck 3. Therefore, when the temperature of chuck 3 is reduced, it is necessary to prevent falling of water drops formed on chuck 3. Water condensation on the lower surface of chuck 3, therefore, can be reliably prevented, since the lower surface of chuck 3 is heated by heater 35. The water condensation on the surface of chuck 3 at the time of the cooling can be prevented by blowing $N_2$ gas or dry air against the surface. Further, what is called a cradle and hot chuck prober can be readily constructed from the construction of chuck 3 noted above.

Now, the electrode structure of chuck 3 will be described in detail with reference to FIG. 5.

The surface of chuck top 32 is provided with voltage measurement electrode 36 and voltage application electrode 37, these electrodes being made of gold or the like.

Voltage measurement electrode 36 has two measurement electrode connection terminals 38, which are formed on opposite sides of chuck top 32 and located on a line passing substantially through the center of chuck top 32. It consists of a strip-like electrode extending along the line noted above and a plurality of electrodes branching from the strip-like electrode in opposite directions and arranged concentrically.

Voltage application electrode 37 has two electrode connection terminals which are formed on opposite sides of chuck top 32 and located on a line substantially perpendicular to the line noted above. It is disposed between voltage measurement electrode 36 and consists of electrodes having substantially the same shape as voltage measurement electrode 36.

Voltage measurement electrode 36 and voltage application electrode 37 are arranged alternately on the surface of chuck top 32 and are spaced apart a predetermined distance and electrically insulated from each other. The portions of chuck top 32 between voltage measurement electrode 36 and voltage application electrode 37 are provided with grooves and small holes for attracting wafer 2 by suction.

Wafer 2 is placed on chuck top 32 and held by the suction of a vacuum chuck. Then, a predetermined voltage is applied from voltage application electrode 37 to a collector electrode on the back side of wafer 2. This voltage is measured by voltage measurement electrode 36. Prover needles 5 are connected to the emitter electrode, base electrode, etc. formed on the back surface of wafer 2.

Thus, strip-like voltage measurement electrodes 36 and voltage application electrodes 37, which are arranged alternately, are in contact with the lower surface of each chip 1 formed on wafer 2. Thus, it is possible to prevent the generation of measurement errors by the prober due to variations in the position of wafer 2 with respect to the electrodes on the back surface of wafer 2 and the corresponding variations in electric resistance.

Now, the correction of error due to a difference between the pitch a of arrangement of the chips (hereinafter referred to as chip pitch) and pitch a' of movement of wafer 2 in the prober having the above construction will be described. Fluctuations of the chip size due to fixing distortion of wafer 2 in the photolithographic step are usually rare. Therefore, the method will be described in connection with a case of correction by recognizing an X-direction (or Y-direction) error that is produced with movement of wafer 2.

The coolant is circulated through the path of cooling jacket 31, and the surface of chuck top 32 is set to a predetermined temperature by energizing heater 35.

When the desired temperature state of chuck top 32 is attained, wafer 2, which has been correctly positioned by an alignment section (not shown), is transferred to chuck top 32 and secured to the same by the attraction of chuck 3.

Then, the pattern of predetermined location B of wafer 2 (see FIG. 1) is recognized by picking it up with television camera 16. The pattern image of location B as recognized is as shown in FIG. 6(a), and it can be visually confirmed with a predetermined picture tube. The pattern image of location B as recognized is provided as an electric signal from pattern recognition unit 17.

Then, wafer 2 is moved for 7 chip pitches, for instance, along X-rails 8 by driving X-Y stage 4. It is now assumed that a pattern image as shown in FIG. 6(b), containing deviation $X_0$, is obtained on pattern recognition unit 17. A pattern image of final point C of movement of wafer 2 is photographed in a state deviated by $X_0$ in the X-direction. The pattern image of final point C is also provided as electric signal to CPU 18.

CPU 18 calculates the deviation for one chip pitch, i.e., deviation X per pitch of movement of X-Y stage 4, as $X=X_0/7$ from the movement of wafer 2 for 7 chip pitches and deviation $X_0$. This deviation ($X_0$) indicates the difference between the moving distance of wafer 2 and the arrangement pitch of chips. According to the deviation X calculated in this way, the extent of rotation of X-axis drive motor M1 is corrected so that a correct pattern image can be obtained at final point C. In consequence, with subsequent movement of wafer 2, X-axis drive motor M1 is driven to effect a proper extent of rotation, so that deviation accompanying the movement of wafer 2 can be compensated for.

When wafer 2 is moved with the deviation $X_0$ set to zero, a pattern image at point B of the start of movement has to be obtained as shown by a broken line in FIG. 6(b). Therefore, the determination of the deviation $X_0$ by CPU 18 is done through comparison of the previously input pattern image shown in FIG. 6(a) and pattern image of FIG. 6(b).

Wafer 2 is also moved in the Y-direction as in the case of movement in the X-direction along Y-rails 9, and correction of deviation $Y_0$ that is generated at this time is done in the same way.

After the extents of rotation of X- and Y-axis drive motors M1 and M2 have been corrected in the above way, the electric characteristics of each chip 1 formed on wafer 2 to be measured are measured with test head 7 by moving wafer 2 with X-Y stage 4 to a predetermined distance in a desired direction. Thus, prober needles 5 are brought into contact with the pads of each chip 1 at the same position at all times, so that it is possible to measure the electric characteristics of each chip 1 very accurately. It is possible to prevent measurement error due to differences in the positioning of wafer and the electrodes on the back surface of wafer 2 because the strip-like voltage measurement electrode and voltage application electrode on chuck top 32 used for the measurement of electric characteristics are electrically insulated from each other. Thus, the accuracy of measurement can be further improved. The accuracy of measurement can be further enhanced for the surface temperature of chuck top 32 is set with very high accuracy by cooling jacket 31 and heater 35.

The above embodiment has been concerned with the correction of error accumulation accompanying the movement of wafer 2. However, if there are fluctuations in the chip size in the process of manufacturing wafer 2, such errors can be compensated for by recognizing a pattern image of each chip and controlling the extent of motor rotation according to the recognized pattern image for each chip. In this case, the correction of error is desirably done concurrently with the measurement of the electric characteristics of the chip. Thus, television camera 16 needs to be provided on insert ring 6.

The probe apparatus according to the invention is applicable, not only to the case of the prober as in the above embodiment, but also to various other processes of various devices having an X-Y stage such as an inspection process and a stepper exposure process.

What is claimed is:

1. A probe apparatus comprising:
   means for moving a semiconductor wafer having a plurality of chips, said plurality of chips being arranged in patterns and said plurality of chips having a predetermined pitch;
   measuring means for measuring an electric characteristic of each chip of said plurality of chips on said semiconductor wafer while said semiconductor wafer is being moved;
   pattern recognition means for evaluating the patterns of said plurality of chips at at least two predetermined locations on said semiconductor wafer;
   detecting means for detecting an arrangement pitch of said plurality of chips and for detecting a pitch at which said semiconductor wafer is moving along;
   calculation means for calculating a difference between said arrangement pitch and said pitch at which said semiconductor wafer is moving along;
   means for correcting said difference such that said arrangement pitch and said pitch at which said semiconductor wafer is moving along are identical.

2. The probe apparatus according to claim 1, wherein:

the difference between said arrangement pitch and said pitch at which said semiconductor wafer is moving along results from a mechanical error associated with the movement of said semiconductor wafer.

3. The probe apparatus according to claim 1, wherein:
the difference between said arrangement pitch and said pitch at which said semiconductor wafer is moving along results from fluctuations in the chip size of said plurality of chips which may occur in the process of forming chips on the wafer.

4. The probe apparatus according to claim 1, wherein:
the difference between said arrangement pitch and said pitch at which said semiconductor wafer is moving along results from temperature variations of said semiconductor wafer.

5. A probe apparatus comprising:
means for moving a semiconductor wafer having a plurality of chips, said plurality of chips being arranged in patterns and said plurality of chips having a predetermined pitch;
measuring means for measuring an electric characteristic of each chip of said plurality of chips on said semiconductor wafer while said semiconductor wafer is being moved;
pattern recognition means for evaluating the patterns of said plurality of chips at at least two predetermined locations on said semiconductor wafer;
detecting means for detecting an arrangement pitch of said plurality of chips and for detecting a pitch at which said semiconductor wafer is moving along;
calculation means for calculating a difference between said arrangement pitch and said pitch at which said semiconductor wafer is moving along;
means for correcting said difference such that said arrangement pitch and said pitch at which said semiconductor wafer is moving along are identical;
means for uniformly controlling said semiconductor wafer's temperature level.

* * * * *